US010909424B2

(12) United States Patent
Kwan (10) Patent No.: US 10,909,424 B2
(45) Date of Patent: Feb. 2, 2021

(54) METHOD AND SYSTEM FOR OBJECT TRACKING AND RECOGNITION USING LOW POWER COMPRESSIVE SENSING CAMERA IN REAL-TIME APPLICATIONS (71) Applicant: Applied Research, LLC, Rockville, MD (US)

(72) Inventor: Chiman Kwan, Rockville, MD (US)

(73) Assignee: Applied Research, LLC, Rockville, MD (US)

( * ) Notice: Subject to any disclaimer, the term of this patent is extended or adjusted under 35 U.S.C. 154(b) by 117 days.

(21) Appl. No.: 16/159,617

(22) Filed: Oct. 13, 2018

(65) Prior Publication Data

US 2020/0160110 A1    May 21, 2020

(51) Int. Cl.
| | |
|---|---|
| G06K 9/00 | (2006.01) |
| G06K 9/32 | (2006.01) |
| G06K 9/62 | (2006.01) |
| H03M 7/30 | (2006.01) |

(52) U.S. Cl.
CPC ........ *G06K 9/6257* (2013.01); *G06K 9/00711* (2013.01); *G06K 9/3241* (2013.01); *G06K 9/6212* (2013.01)

(58) Field of Classification Search
None
See application file for complete search history.

(56) References Cited

U.S. PATENT DOCUMENTS

| | | | | |
|---|---|---|---|---|
| 2019/0130191 | A1* | 5/2019 | Zhou | G06K 9/00744 |
| 2019/0130583 | A1* | 5/2019 | Chen | G06T 7/11 |
| 2019/0180467 | A1* | 6/2019 | Li | G06K 9/00201 |
| 2019/0325259 | A1* | 10/2019 | Murphy | G06K 9/6259 |

OTHER PUBLICATIONS

Zhang et al., "Compact all-CMOS spatiotemporal compressive sensing video camera with pixel-wise coded exposure," Optics Express, vol. 24, Issue 8, pp. 9013-9024 (2016) (Year: 2016).*
Redmon et al., "You Only Look Once: Unified, Real-Time Object Detection," 2016 IEEE Conference on Computer Vision and Pattern Recognition (CVPR), Dec. 12, 2016 (Year: 2016).*

(Continued)

*Primary Examiner* — Soo Shin
(74) *Attorney, Agent, or Firm* — IP-R-US, LLC; Peter S. Wong (57) ABSTRACT

The present invention integrates a low power and high compression pixel-wise coded exposure (PCE) camera with advanced object detection, tracking, and classification algorithms into a real-time system. A PCE camera can control exposure time of every pixel in the camera and at the same time can compress multiple frames into a compressed frame. Consequently, it can significantly improve the dynamic range as well as reduce data storage and transmission bandwidth usage. Conventional approaches utilize PCE camera for object detection, tracking and classification, require the compressed frames to be reconstructed. These approaches are extremely time consuming and hence makes the PCE cameras unsuitable for real-time applications. The present invention presents an integrated solution that incorporates advanced algorithms into the PCE camera, saving reconstruction time and making it feasible to work in real-time applications.

12 Claims, 5 Drawing Sheets

Signal flow for the training of YOLO and ResNet using compressive measurements (56) References Cited

OTHER PUBLICATIONS

J. Zhang, T. Xiong, T. Tran, S. Chin, and R. Etienne-Cummings. "Compact all . . . camera with pixel-wise coded exposure," Optics Express, vol. 24, No. 8, pp. 9013-9024, Apr. 2016.
J. Redmon, A. Farhadi, "YOLOv3: An Incremental Improvement," arxiv, Apr. 2018.
S. Ren et al., "Faster R-CNN: Towards real-time object detection with region proposal networks," Advances in neural information processing systems. 2015.
He X. Zhang, S. Ren, and J. Sun, "Deep Residual Learning for Image Recognition," Conference on Computer Vision and Pattern Recognition, 2016.
Bertinetto, L. et al.: Staple: Complementary Learners for Real-Time Tracking. Conference on Computer Vision and Pattern Recognition. (2016).
M. Dao, C. Kwan, K. Koperski, and G. Marchisio, "A Joint Sparsity Approach . . . " IEEE Electronics & Mobile Communication Conference, pp. 322-328, NYC, Oct. 2017.
J. Zhou, B. Ayhan, C. Kwan, and T. Tran, "ATR Performance Improvement Using Images with Corrupted or Missing Pixels," Proc. SPIE 10649, Apr. 30, 2018.

\* cited by examiner

PRIOR ART (a) Conventional camera vs. Pixel-wise Coded Exposure (PCE) Compressed Image/Video Sensor (b) Proposed system directly uses the motion coded image for object tracking and recognition without frame reconstruction.

Fig.1: Comparison of conventional and proposed systems

Fig. 2: Partial sensing mask cube. Colored dots in the cube denote non-zero entries (activated pixels); white part is all zero (dormant pixels)

Fig. 3. Signal flow for the training of YOLO and ResNet using compressive measurements Fig. 4. Signal flow for object detection, tracking, and classification directly using compressive measurements Fig. 5: STAPLE tracking results for the PCE Full case. Frames: 10, 30, 50, 70, 90, 110 shown Fig. 6: STAPLE tracking results for the PCE 50% case. Frames: 10, 30, 50, 70, 90, 110 shown Fig. 7: YOLO tracking results for PCE Full case. Frames 1, 16, 31, 45, 60, and 89 shown. Train using Video 4 and test using Video 5

Fig. 8: Tracking results for frames 1, 16, 31, 45, 60, and 89. PCE 50 case. Train using Video4 and test using Video5

Fig. 9: Tracking results for frames 1, 16, 31, 45, 60, and 89. PCE 25 case. Train using Video4 and test using Video5

METHOD AND SYSTEM FOR OBJECT TRACKING AND RECOGNITION USING LOW POWER COMPRESSIVE SENSING CAMERA IN REAL-TIME APPLICATIONS

ORIGIN OF THE INVENTION

This invention was made with Government support under contract FA8651-17-C-0017 awarded by the Air Force. The Government has certain rights in this invention.

BACKGROUND OF THE INVENTION

Pixel-wise Coded Exposure (PCE) camera has several key advantages, such as, high compression ratio, low power consumption, high dynamic range, etc. However, it is not suitable for real-time object tracking and recognition because a time-consuming process is needed to reconstruct the video frames from the compressed data. In some cases, it may take quite a few minutes to reconstruct a single frame. This is too slow for real-time applications. The present invention proposes a system that can directly perform object tracking and recognition without reconstruction. Hence, the tracking and recognition can be done in real-time (20 to 30 frames per second). The training of this system might take hours, but that can be done off-line.

Reconstruction involves solving some complicated functions and it takes many minutes to reconstruct a single frame as mentioned. Conventional tracking and recognition fail to perform if there is no reconstruction. The system of the present invention bypasses the reconstruction step and directly performs the tracking and recognition. This system can achieve high performance (e.g. high accuracy, low false alarms, etc.) real-time processing through the use of deep learning algorithms known as You Only Look Once (YOLO) and Residual Network (ResNet).

The present invention also improves on saving data storage, bandwidth usage and achieving high dynamic range. The application of YOLO and ResNet deep learning algorithms in the present invention ensures a high-performance object tracking and recognition system. Real-time application is also one of the performance metrics in tracking and recognition. The histogram matching, and voting are used to further enhance the recognition performance.

BRIEF SUMMARY OF THE INVENTION

One embodiment of the present invention is to provide a method and system, which carries out object detection, tracking, and classification using a compressive sensing camera, which is a pixel-wise coded exposure (PCE) or coded aperture (CA) camera that saves power through exposure control for each individual pixel.

Another embodiment of the present invention is to provide a method and system that can save data storage space and transmission bandwidth of videos.

Another embodiment of the present invention is to use a coded aperture camera which can generate compressive measurements that have much fewer frames.

Another embodiment of the present invention is to apply individual exposure control to each pixel to compress the video data. Although moving targets may be smeared due to long exposure times for some pixels, the dynamic range can be significantly improved.

Another embodiment of the present invention is to use a deep learning based tracker known as You Only Look Once (YOLO), which does not require initial bounding boxes on targets/objects. YOLO can track multiple objects simultaneously. In contrast, many tracking algorithms in the literature do require humans to put a bounding box around the objects in the first frame.

Another embodiment of the present invention is to apply a Residual Network (Res-Net) based algorithm to perform object classification. ResNet allows customized training in limited frames scenarios. Synthesized training samples with different illuminations, different scales, and different orientations can be generated.

Another embodiment is about using histogram matching to match all videos to some specific frame reference. This will significantly improve the object detection, tracking, and classification performance.

Another embodiment of the present invention is that a decision level fusion based on voting is applied that can further improve the classification performance.

Another embodiment of the present invention is that the algorithm can be applied to stationary camera or moving camera. Moreover, the cameras can be color, monochrome, infrared, multispectral, and hyperspectral imagers.

Another embodiment of the present invention is that the algorithms can be implemented in low cost Digital Signal Processor (DSP) and Field Programmable Gate Array (FPGA) for real-time processing.

BRIEF DESCRIPTION OF THE DRAWINGS

FIGS. 1(*a*) & 1(*b*) illustrate Conventional camera vs. Pixel-wise Coded Exposure (PCE) Compressed Image/Video Sensor.

DETAILED DESCRIPTION OF THE INVENTION

Video Imager with PCE

Figure 1:
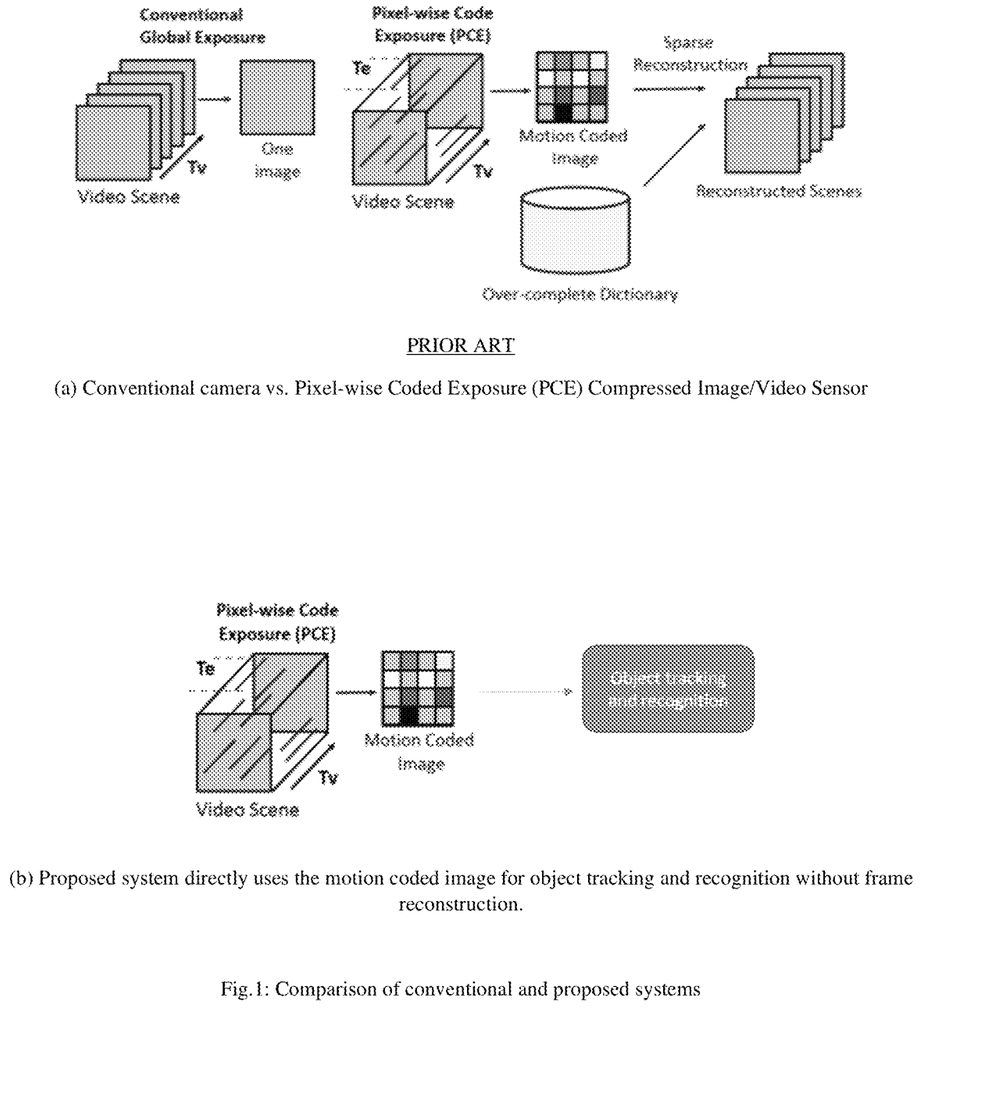

The present invention employs a sensing scheme based on pixel-wise coded exposure (PCE) or also known as Coded Aperture (CA) camera as described in [1]. FIG. 1(*a*) illustrates the differences between a conventional video sensing scheme and PCE, where random spatial pixel activation is combined with fixed temporal exposure duration. First, conventional cameras capture frames at certain frame rates such as 30 frames per second. In contrast, PCE camera captures a compressed frame called motion coded image over a fixed period of time (Tv). For example, a user can compress 30 conventional frames into a single motion coded frame. This will yield significant data compression ratio. Second, the PCE camera allows a user to use different exposure times for different pixel locations. For low lighting regions, more exposure times can be used and for strong light areas, short exposure can be exerted. This will allow high dynamic range. Moreover, power can also be saved via low sampling rate in the data acquisition process. As shown in FIG. 1(a), one conventional approach to use the motion coded images is to apply sparse reconstruction to reconstruct the original frames. This process may be very time consuming and not suitable for real-time applications.

Conventional approaches to use PCE cameras involve frame reconstruction from the compressed frames using sparsity based methods [6] [7], which are extremely time consuming and unsuitable for real-time applications.

Instead of doing sparse reconstruction on PCE images or frames, the scheme of the present invention as shown in FIG. 1(b) directly acts on the PCE or Coded Aperture Images, which contain raw sensing measurements without the need for any reconstruction effort. However, utilizing raw measurements has several challenges:

1) Moving objects may be smeared if the exposure times are long.
2) There are also missing pixels in the raw measurements because not all pixels are activated during the data collection process.
3) There are much fewer frames in the raw video because many original frames are compressed into a single coded frame.

The PCE Full Model (PCE Full or CA Full) is quite similar to a conventional video sensor: every pixel in the spatial scene is exposed for exactly the same duration of one second. However, motion is expected to be blurred significantly. This simple model still produces a compression ratio of 30:1. However, there is not much saving in sensing power since all pixels are exposed at all time.

Next, the sensing model labeled as PCE 50% or CA 50% uses the following set of parameters. For each frame, there are roughly 1.85% pixels being activated. The exposure time is Te=133.3 ms. Therefore, each exposed pixel stays continuously active for 4-frame duration. In short, the present invention outputs ONE coded aperture image for every group of 30 frames, resulting in a temporal sensing ratio of 1 frame per second (fps) or equivalently 30:1 compression ratio in terms of frame rate. In every frame, a new set of pixels that have not been activated yet would be selected for activation. Once activated, each pixel would have exactly the same exposure duration. This scheme results in 50% of the pixels locations being captured in various time-stamp within one sensing period (1 second), resulting in a single coded aperture image or PCE frame with 50% activated pixels for every 30 conventional video frames. The PCE 50% Model yields a data saving ratio of 1/30×1/2=1/60 and a power saving ratio of 1/60×4=1/15.

For the PCE 25% or CA 25% Model, the percentage of pixels activated per frame is further decreased so that the final output PCE frame contains only 25% of randomly activated pixel locations. The exposure duration is still set at the same conventional 4-frame duration. A simple way to generate PCE 25% data is to randomly ignore half of the measurements collected from the PCE 50% Model. The PCE 25% Model yields a data saving ratio of 1/30×1/4=1/120 and a power saving ratio of 1/120×4=1/30. Note that the present invention can easily reduce the sensing power by limiting a much shorter exposure duration. This might be advantageous for tracking fast-moving objects at the expense of noisier measurements at low-light conditions.

Table 1 below summarizes the comparison between the three sensing models.

TABLE 1

| Comparison in Data Compression Ratio and Power Saving Ratio between Three Sensing Models. | | | |
|---|---|---|---|
| | PCE Full/CA Full | PCE 50%/CA 50% | PCE 25%/CA 25% |
| Data Saving Ratio | 30:1 | 60:1 | 120:1 |
| Power Saving Ratio | 1:1 | 15:1 | 30:1 |

Figure 2:
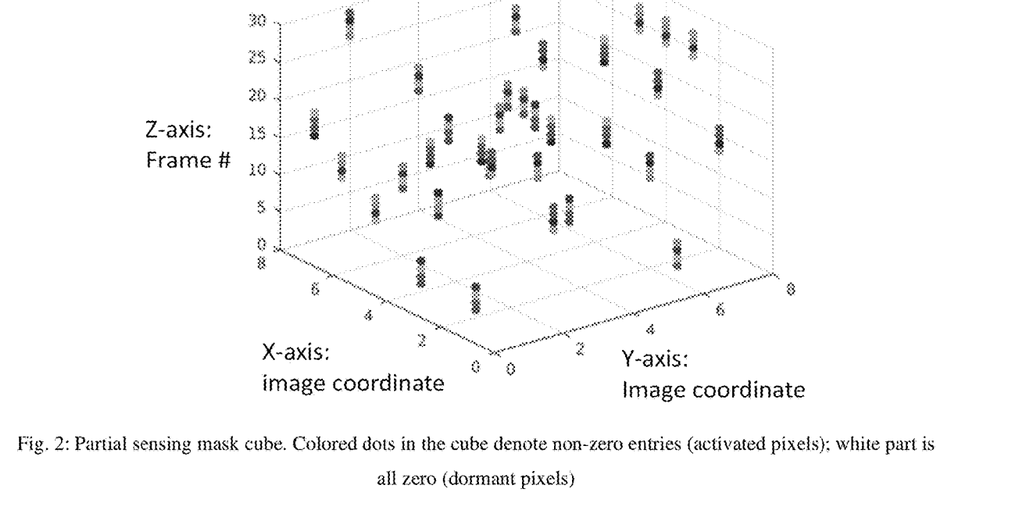
FIG. 2 illustrates an example of part of a sensing mask. Colored dots denote non-zero entries (activated pixels), and white part of the cube is all zero (dormant pixels).

A small portion of the sensing mask in 3-dimensional spatio-temporal space for the PCE 50% Model is shown in FIG. 2. Colored dots denote non-zero entries (activated pixels being exposed) whereas white part of the spatio-temporal cube is all zero (these pixels are staying dormant). The horizontal axis is the time domain, and the reader is reminded that each exposed pixel stays active for an equivalent duration of 4 continuous frames.

Figure 3:
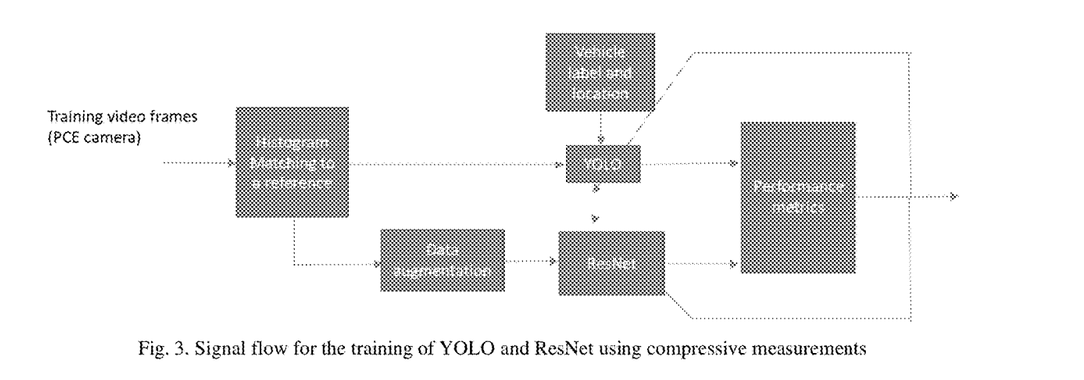
FIG. 3. illustrates signal flow for the training of YOLO and ResNet using compressive measurements.

Integrated Framework for Object Detection, Tracking, and Classification Directly in Compressive Measurement Domain In the present invention, two deep learning algorithms are integrated into the PCE camera. FIG. 3 illustrates the key steps in training YOLO and Res-Net. During the preparation stage, all the training video frames need to be histogram matched to a common reference. This is one critical step, which is not normally deployed in many conventional tracking and classification schemes. The object label and location information need to be extracted and saved in a text file. Data augmentation is also done during the preparation stage where the cropped objects will be scaled up and down, rotated by different angles, and lightened up and down.

After the preparation is done, the YOLO tracker will be trained via some standard procedures. One useful technique for the training part is about the burn-in period. It is found necessary to perform 1000 epochs of burn-in using a small learning rate. This will prevent unstable training. Another technique is that if there are multiple objects that need to be tracked, it will be better to create a single class model that lumps all the objects into one single class. Otherwise, the training will never converge. In the training of Res-Net, data augmentation plays a critical role, especially when there are not that many video frames for training.

In training both the YOLO and Res-Net, there is an iterative process that improves over time by using feedback information from the ground truth and the training results.

Figure 4:
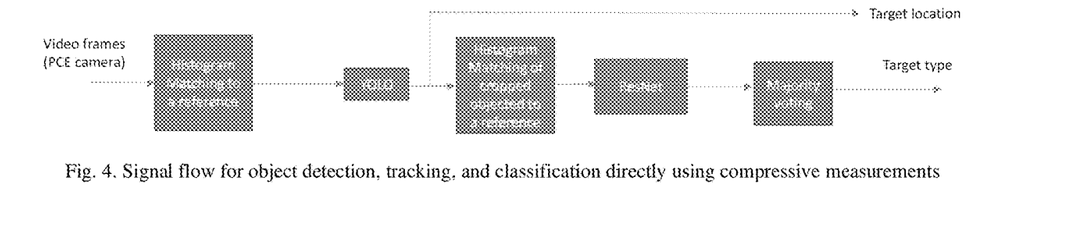
FIG. 4. illustrates signal flow for object detection, tracking, and classification directly using compressive measurements.

FIG. 4 illustrates the key steps in the testing or real-time operations. During the testing part, it is also necessary to histogram match the input video frames to the same common reference in the training process. This will significantly improve the tracking and classification performance. After that, YOLO tracker will give out object locations, which will be histogram matched to a reference again and then used by the Res-Net for classification. The second histogram matching is also critical for improving the classification performance. To further improve the classification accuracy, a decision fusion based on majority voting can be used. Finally, the target type and location information will be displayed on the output videos.

The following metrics are used in the present invention for evaluating the YOLO tracker performance:
  Center Location Error (CLE): It is the error between the center of the bounding box and the ground-truth bounding box.
  Distance Precision (DP): It is the percentage of frames where the centroids of detected bounding boxes are within 20 pixels of the centroid of ground-truth bounding boxes.
  EinGT: It is the percentage of the frames where the centroids of the detected bounding boxes are inside the ground-truth bounding boxes.
  Number of frames with detection: This is the total number of frames that have detection.
  Classification metrics can be confusion matrices. The correct and false detection percentages will be tabulated in confusion matrices.

Histogram Matching

Since histogram matching is an important step in both the training and testing process, the idea is briefly summarized below. The idea of histogram matching is to histogram match all frames to a common reference with a fixed mean and standard deviation. Two histogram matching steps are implemented: one for the whole frame and another one for the image patches inside the bounding boxes.

For whole frame, the formula is given by:

$$F_{i\text{-}new}=(F_i-\text{mean}(F_i))/\text{std}(F_i)*\text{std}(R)+\text{mean}(R)$$

where $F_i$ is the $i^{th}$ frame before histogram matching and $F_i$-new is $i^{th}$ frame after matching, R is a reference frame selected by the user.

For patch inside the bounding box, the formula is given by:

$$P_{i\text{-}new}=(P_1-\text{mean}(P_i))/\text{std}(P_i)*\text{std}(R)+\text{mean}(R)$$

where $P_i$ is the patch containing objects and the patches are detected by the YOLO tracker.

YOLO Tracker

YOLO tracker [2] is fast and has similar performance as Faster R-CNN [3]. In the present invention, YOLO is picked because it is easy to install and is also compatible with the hardware, which seems to have a hard time to install and run Faster R-CNN. The training of YOLO is quite simple. Images with ground truth target locations are needed.

YOLO has 24 convolutional layers followed by 2 fully connected layers. Details can be found in [3]. The input images are resized to 448×448. It has some built-in capability to deal with different target sizes and illuminations. However, it is found that histogram matching is essential in order to make the tracker more robust to illumination changes.

YOLO also comes with a classification module. However, based on evaluations, the classification accuracy using YOLO is not as good as can be seen in Section 3. This is perhaps due to a lack of training data. In the training of YOLO, one needs to apply several important techniques. First, burn-in is critical by training the YOLO using very small learning rate for about one thousand epochs. Second, the performance is better if all the targets/objects are lumped into a single model.

ResNet Classifier

The ResNet-18 model [4] is an 18-layer convolutional neural network (CNN) that has the advantage of avoiding performance saturation and/or degradation when training deeper layers. It is a common problem among other CNN architectures. The ResNet-18 model avoids the performance saturation by implementing an identity shortcut connection. It skips one or more layers and learns the residual mapping of the layer rather than the original mapping.

Training of ResNet requires target patches. The targets are cropped from training videos. Mirror images are then created. Then, data augmentation is performed using scaling (larger and smaller), rotation (every 45 degrees), and illumination (brighter and dimmer) to create more training data. For each cropped target, the present invention is capable of creating a data set with 64 more images.

Conventional Tracker Results

Some tracking results using a conventional tracker known as STAPLE [5] are first presented. STAPLE requires the target location to be known in the first frame. After that, STAPLE learns the target model online and tracks the target. Two cases are shown here: PCE full and PCE 50%.

Figure 5:
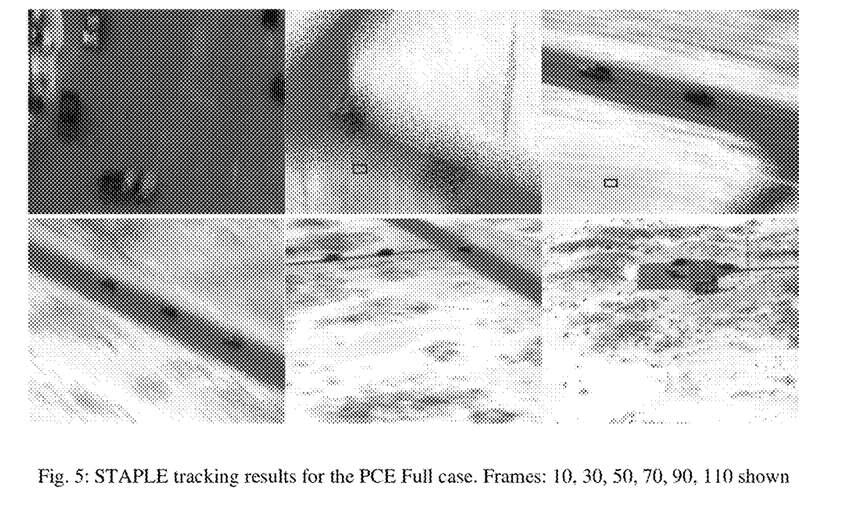
FIG. 5: illustrates STAPLE tracking results for a PCE full case. Frames: 10, 30, 50, 70, 90, 110 are shown here.
Figure 6:
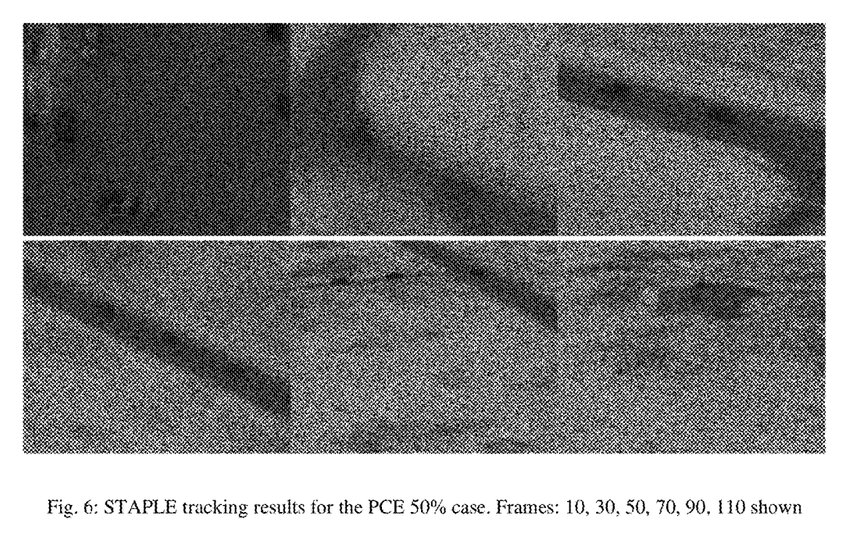
FIG. 6: illustrates STAPLE tracking results for a PCE 50% case. Frames: 10, 30, 50, 70, 90, 110 are shown here.

As shown in FIG. 5-FIG. 6, STAPLE was not able to track any targets in subsequent frames. This shows the difficulty of target tracking using PCE cameras.

YOLO Results

Figure 7:
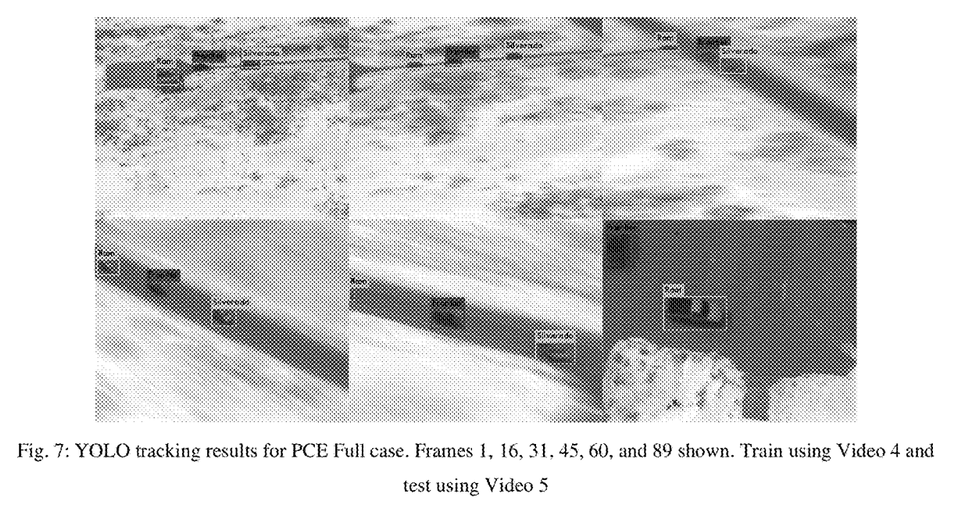
FIG. 7: illustrates YOLO tracking results for frames 1, 16, 31, 45, 60, and 89 for a PCE full case. Train using Video 4 and test using Video 5.
Figure 8:
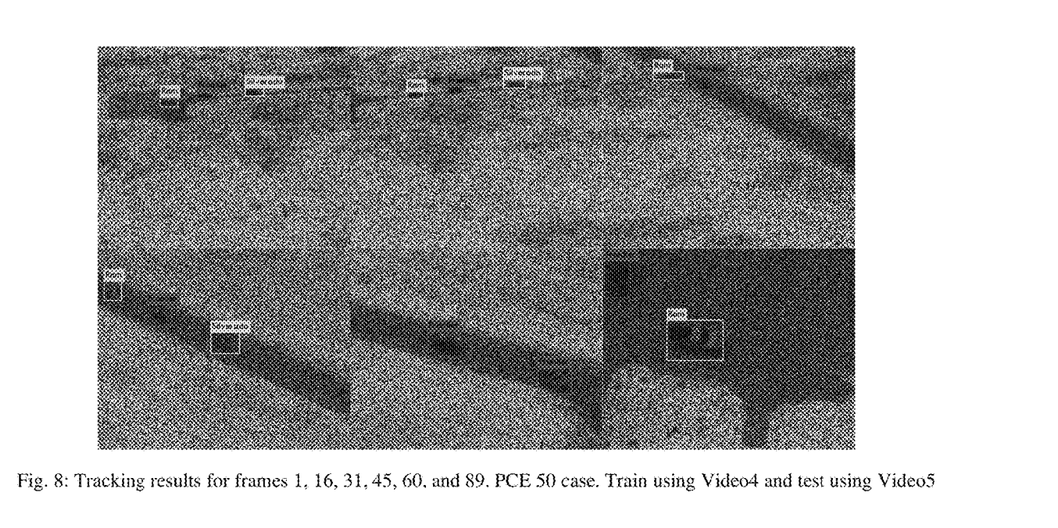
FIG. 8: illustrates tracking results for frames 1, 16, 31, 45, 60, and 89 for a PCE 50 case. Train using Video 4 and test using Video 5.
Figure 9:
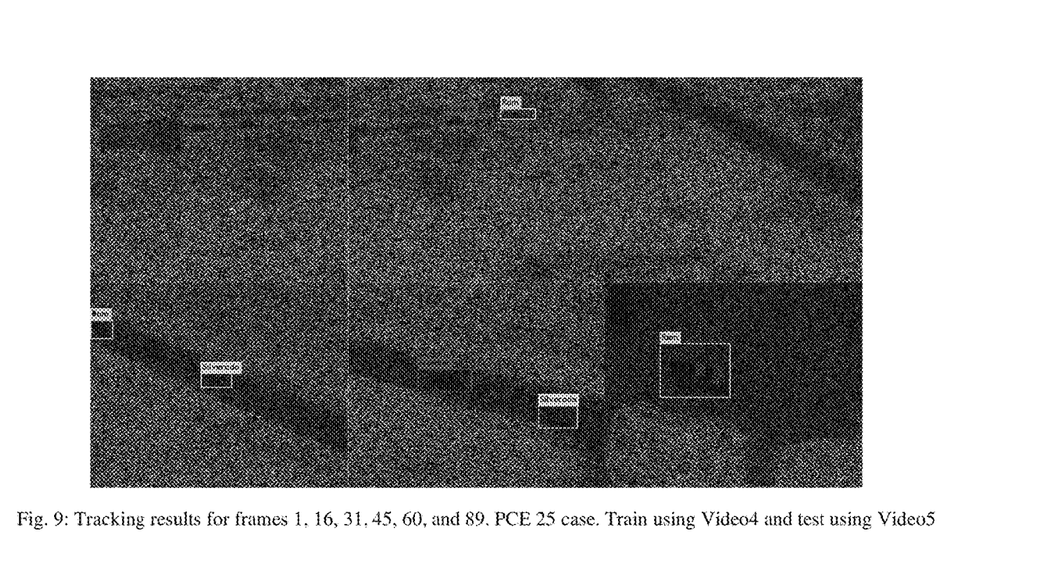
FIG. 9: illustrates tracking results for frames 1, 16, 31, 45, 60, and 89 for a PCE 25 case. Train using Video 4 and test using Video 5.

Some results where training was done using only one video called Video 4 and testing using another video called Video 5 are shown in FIG. 7-FIG. 9. Table 2-Table 4 show the tracking results for PCE full, PCE 50, and PCE 25, respectively. The trend is that when image compression increases, the performance drops accordingly. This can be corroborated in the snapshots as shown in FIG. 7-FIG. 9, where some targets do not have bounding boxes around them in the high compression cases.

TABLE 2

Tracking metrics for PCE full. Train using Video 4 and test using Video 5.

|  | CLE | DP | E in GT | Number of frames with detection |
|---|---|---|---|---|
| Ram | 5.07 | 1 | 0.93 | 74/89 |
| Frontier | 4.59 | 1 | 0.74 | 82/89 |
| Silverado | 5.69 | 1 | 0.98 | 63/89 |

TABLE 3

Tracking metrics for PCE 50. Train using Video 4 and test using Video 5.

|  | CLE | DP | E in GT | Number of frames with detection |
|---|---|---|---|---|
| Ram | 7.08 | 1 | 0.97 | 74/89 |
| Frontier | 6.1 | 1 | 0.75 | 83/89 |
| Silverado | 6.56 | 1 | 1 | 65/89 |

TABLE 4

Tracking metrics for PCE 25. Train using Video 4 and test using Video 5.

|  | CLE | DP | E in GT | Number of frames with detection |
|---|---|---|---|---|
| Ram | 9.07 | 1 | 0.97 | 39/89 |
| Frontier | 6.85 | 1 | 0.74 | 67/89 |
| Silverado | 10.9 | 1 | 0.88 | 33/89 |

Classification Using ResNet

Here, two classifiers are applied: YOLO and ResNet. It should be noted that classification is performed only when there are good detection results from the YOLO tracker. For some frames in the PCE 50 and PCE 25, there may not be positive detection results and for those frames, no classification result is generated.

Similar to the tracking case, the training was done by using Video 4 and the testing was done by using Video 5. Table 5-Table 7 show the classification results using YOLO and ResNet. The first observation is that the ResNet performance is better than that of YOLO. The second observation is that the classification performance deteriorates with high missing rates. The third observation is that Ram and Silverado have lower classification rates. This is because Ram and Silverado have similar appearances. A fourth observation is that the results in Table 7 appear to be better than other cases. This may be misleading, as the classification is done only for frames with good detection.

TABLE 5

Classification results for PCE full case. Video 4 for training and Video 5 for testing.

| | Ram | Frontier | Silverado | Classification Accuracy |
|---|---|---|---|---|
| (a) YOLO classifier outputs. | | | | |
| Ram | 13 | 10 | 50 | 0.1781 |
| Frontier | 9 | 69 | 3 | 0.8519 |
| Silverado | 55 | 0 | 7 | 0.1129 |
| (b) ResNet classifier outputs. | | | | |
| Ram | 48 | 17 | 9 | 0.6486 |
| Frontier | 15 | 67 | 0 | 0.8171 |
| Silverado | 16 | 19 | 28 | 0.4444 |

TABLE 6

Classification results for PCE 50 case. Video 4 for training and Video 5 for testing.

| | Ram | Frontier | Silverado | Classification Accuracy |
|---|---|---|---|---|
| (a) YOLO classifier outputs. | | | | |
| Ram | 15 | 37 | 19 | 0.2113 |
| Frontier | 8 | 75 | 0 | 0.9036 |
| Silverado | 60 | 0 | 5 | 0.0769 |
| (b) ResNet classifier outputs | | | | |
| Ram | 26 | 5 | 43 | 0.3514 |
| Frontier | 9 | 53 | 21 | 0.6386 |
| Silverado | 11 | 1 | 53 | 0.8154 |

TABLE 7

Classification results for PCE 25 case. Video 4 for training and Video 5 for testing.

| | Ram | Frontier | Silverado | Classification Accuracy |
|---|---|---|---|---|
| (a) YOLO classifier outputs. | | | | |
| Ram | 18 | 14 | 7 | 0.4615 |
| Frontier | 15 | 50 | 2 | 0.7463 |
| Silverado | 28 | 0 | 5 | 0.1515 |
| (b) ResNet classifier outputs | | | | |
| Ram | 29 | 9 | 1 | 0.7436 |
| Frontier | 0 | 69 | 0 | 1.0000 |
| Silverado | 17 | 3 | 13 | 0.3939 |

Post-Classification Enhancement Step

To further increase the classification performance, a decision level fusion is proposed, which is based on voting. At a particular instant, the classification decision is based on all decisions made in the past N frames. That is, the decision is based on majority voting. The class label with the most votes will be selected as the decision at the current instance.

It will be apparent to those skilled in the art that various modifications and variations can be made to the system and method of the present disclosure without departing from the scope or spirit of the disclosure. It should be perceived that the illustrated embodiments are only preferred examples of describing the invention and should not be taken as limiting the scope of the invention.

REFERENCES

[1] J. Zhang, T. Xiong, T. Tran, S. Chin, and R. Etienne-Cummings. "Compact all-CMOS spatio-temporal compressive sensing video camera with pixel-wise coded exposure," Optics Express, vol. 24, no. 8, pp. 9013-9024, April 2016.
[2] J. Redmon, A. Farhadi, "YOLOv3: An Incremental Improvement," arxiv, April 2018.
[3] S. Ren et al., "Faster R-CNN: Towards real-time object detection with region proposal networks," Advances in neural information processing systems. 2015.
[4] K. He X. Zhang, S. Ren, and J. Sun, "Deep Residual Learning for Image Recognition," Conference on Computer Vision and Pattern Recognition, 2016.
[5] Bertinetto, L. et al.: Staple: Complementary Learners for Real-Time Tracking. Conference on Computer Vision and Pattern Recognition. (2016)
[6] M. Dao, C. Kwan, K. Koperski, and G. Marchisio, "A Joint Sparsity Approach to Tunnel Activity Monitoring Using High Resolution Satellite Images," IEEE Ubiquitous Computing, Electronics & Mobile Communication Conference, pp. 322-328, New York City, October 2017.
[7] J. Zhou, B. Ayhan, C. Kwan, and T. Tran, "ATR Performance Improvement Using Images with Corrupted or Missing Pixels," Proc. SPIE 10649, Pattern Recognition and Tracking XXIX, 106490E, 30 Apr. 2018.

The invention claimed is:

1. A system for object tracking and recognition in real-time applications comprising:
    a compressive sensing camera generates video frames of motion coded images;
    said motion coded images are directly connected to an object tracking and recognition unit without frames reconstruction; wherein
    said object tracking and recognition unit having a video frames trainer including:
    a histogram matching unit with a first output connected to a You Only Look Once (YOLO) tracker and a second output connected to a data augmentation unit;
    a vehicle label and location unit having a third output connected to said YOLO tracker;
    a Residual Network (ResNet) classifier is connected to a fourth output from said data augmentation unit;
    a fifth output from said YOLO tracker and a sixth output from said ResNet classifier are connected to a performance metrics unit; and
    a seventh output from said performance metrics unit is being fed-back to said YOLO tracker and said ResNet classifier, respectively.
2. The system for object tracking and recognition in real-time applications in accordance to claim 1, wherein:
    the compressive sensing camera is either a pixel-wise coded exposure (PCE) or a Coded Aperture (CA) camera.

3. The system for object tracking and recognition in real-time applications in accordance to claim 2, further comprising:
    a cropped object histogram matching unit is connected between said YOLO tracker and said ResNet classifier; and
    a majority voting unit is connected to said ResNet classifier.

4. The system for object tracking and recognition in real-time applications in accordance to claim 3, wherein:
    the compressive sensing camera generates measurements at a variable compression ratio to save video data storage space and transmission bandwidth.

5. The system for object tracking and recognition in accordance to claim 4, wherein:
    individual exposure control is applied to each pixel to compress video data sent to said video data storage space to increase dynamic range of said motion coded images.

6. The system for object tracking and recognition in real-time applications in accordance to claim 5, wherein:
    said YOLO tracker is a deep learning based tracker which tracks multiple objects simultaneously without initial bounding boxes on said multiple objects.

7. The system for object tracking and recognition in real-time applications in accordance to claim 6, wherein:
    two deep learning algorithms are integrated into the compressive sensing camera.

8. The system for object tracking and recognition in real-time applications in accordance to claim 7, wherein:
    said deep learning algorithms are implemented in Digital Signal Processor (DSP) and Field Programmable Gate Array (FPGA) for real-time processing.

9. A method for object tracking and recognition in real-time applications, comprising the steps of:
    using a compressive sensing camera to produce motion coded images containing raw sensing measurements;
    generating training video frames from the raw sensing measurements directly without frames reconstruction;
    histogram matching said training video frames to a common frame reference to produce a first output and a second output;
    extracting and saving object label and location information from said motion coded images to produce a third output;
    generating augmenting data from said second output to produce a fourth output;
    training a You Only Look Once (YOLO) tracker using said first output and said third output to produce a fifth output;
    training a Residual Network (ResNet) classifier from said fourth output to produce a sixth output;
    selecting classification metrics from said fifth output said sixth output, respectively; and
    feeding back said selected classification metrics to said YOLO tracker and said ResNet classifier.

10. The method for object tracking and recognition in real-time applications in accordance to claim 9, wherein:
    said compressive sensing camera is either a pixel-wise coded exposure (PCE) or a Coded Aperture (CA) camera.

11. The method for object tracking and recognition in real-time applications in accordance to claim 10, further comprising the steps of:
    cropping said histogram matching video frame objects from said YOLO tracker;
    histogram matching said cropped video frame objects to said common frame reference to generate an eighth output feeding to said Residual Network (ResNet) classifier;
    applying a decision level fusion based on majority voting on said eighth output to increase classification performance; and
    displaying said object label and location information on output videos after said decision level fusion.

12. The method for object tracking and recognition in real-time applications in accordance to claim 11, wherein the cropping step further comprising the steps of:
    scaling up or down said cropped histogram matching video frame objects;
    rotating said cropped histogram matching video frame objects by different angles; and
    adjusting the brightness level of said cropped histogram matching video frame objects.

\* \* \* \* \*